(12) United States Patent
Jeon et al.

(10) Patent No.: US 11,980,098 B2
(45) Date of Patent: May 7, 2024

(54) THERMOELECTRIC MODULE

(71) Applicant: LG INNOTEK CO., LTD., Seoul (KR)

(72) Inventors: Seong Jae Jeon, Seoul (KR); Sung Chul Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 99 days.

(21) Appl. No.: 17/881,179

(22) Filed: Aug. 4, 2022

(65) Prior Publication Data

US 2022/0376160 A1 Nov. 24, 2022

Related U.S. Application Data

(63) Continuation-in-part of application No. 16/782,295, filed on Feb. 5, 2020, now Pat. No. 11,723,275.

(30) Foreign Application Priority Data

| Feb. 12, 2019 | (KR) | 10-2019-0016245 |
| Jan. 20, 2020 | (KR) | 10-2020-0007448 |
| Feb. 7, 2020 | (KR) | 10-2020-0015059 |

(51) Int. Cl.
*H10N 10/17* (2023.01)
*H10N 10/81* (2023.01)

(52) U.S. Cl.
CPC ............. *H10N 10/17* (2023.02); *H10N 10/81* (2023.02)

(58) Field of Classification Search
CPC .................................. H10N 10/17; H10N 10/81
See application file for complete search history.

(56) References Cited

U.S. PATENT DOCUMENTS

| 5,865,031 A | 2/1999 | Itakura |
| 6,073,449 A * | 6/2000 | Watanabe ............. H10N 10/17 62/3.2 |

(Continued)

FOREIGN PATENT DOCUMENTS

| JP | 09321348 A * 12/1997 .............. F25B 21/02 |
| JP | 11-055974 A 2/1999 |

(Continued)

OTHER PUBLICATIONS

European Search Report dated Apr. 21, 2020 issued in EP Application No. 20156742.7.

(Continued)

*Primary Examiner* — Golam Mowla
(74) *Attorney, Agent, or Firm* — KED & Associates LLP

(57) ABSTRACT

A thermoelectric module according to an exemplary embodiment includes a first metal substrate including a first through-hole, a first insulating layer disposed on the first metal substrate, a first electrode part disposed on the first insulating layer and including a plurality of first electrodes, a plurality of P-type thermoelectric legs and a plurality of N-type thermoelectric legs disposed on the first electrode part, a second electrode part disposed on the plurality of P-type thermoelectric legs and the plurality of N-type thermoelectric legs and including a plurality of second electrodes, a second insulating layer disposed on the second electrode part, and a second metal substrate disposed on the second insulating layer and including a second through-hole, wherein the first metal substrate includes an effective region in which the first electrode part is disposed and a peripheral region formed outside the effective region, the second metal substrate includes an effective region in which the second electrode part is disposed and a peripheral region formed outside the effective region, the first through-hole occupies a portion of the effective region of the first metal substrate, (Continued)

the second through-hole occupies a portion of the effective region of the second metal substrate, and the first through-hole and the second through-hole are formed at positions corresponding to each other.

20 Claims, 9 Drawing Sheets

(56) References Cited

U.S. PATENT DOCUMENTS

| | | | | |
|---|---|---|---|---|
| 8,956,018 B2* | 2/2015 | Deshpande | ............ | F21S 8/088 362/249.02 |
| 2009/0236087 A1 | 9/2009 | Horio | | |
| 2009/0301540 A1 | 12/2009 | Horio | | |
| 2010/0186424 A1 | 7/2010 | Horio | | |
| 2011/0259385 A1 | 10/2011 | Hiroyama | | |
| 2012/0132242 A1 | 5/2012 | Chu | | |
| 2018/0261751 A1 | 9/2018 | Angermann | | |
| 2020/0075830 A1 | 3/2020 | Spillner | | |

FOREIGN PATENT DOCUMENTS

| | | |
|---|---|---|
| JP | 2873961 | 3/1999 |
| JP | 11-220184 A | 8/1999 |
| JP | 2000-101152 | 4/2000 |
| JP | 2002-353524 | 12/2002 |
| JP | 2006-319262 | 11/2006 |
| JP | 2007-073889 | 3/2007 |
| JP | 2008-277404 A | 11/2008 |
| JP | 2008-294413 A | 12/2008 |
| JP | 2010-021241 A | 1/2010 |
| JP | 2012-069880 | 4/2012 |
| JP | 2016-072579 | 5/2016 |
| TW | 201112462 A1 | 4/2011 |
| WO | WO 2009/031698 | 3/2009 |
| WO | WO 2015/001523 | 1/2015 |
| WO | WO 2018-108195 A1 | 6/2018 |

OTHER PUBLICATIONS

U.S. Office Action dated Mar. 24, 2020 issued in parent U.S. Appl. No. 16/782,295.
U.S. Final Office Action dated Sep. 25, 2020 issued in parent U.S. Appl. No. 16/782,295.
Korean Office Action dated Jan. 12, 2021 issued in Application KR 10-2020-0130386.
Taiwanese Office Action dated Apr. 30, 2021 issued in Application TW 109104243 and English translation.
U.S. Office Action dated Jan. 26, 2022 issued in parent U.S. Appl. No. 16/782,295.
U.S. Final Office Action dated May 13, 2022 issued in parent U.S. Appl. No. 16/782,295.

* cited by examiner

THERMOELECTRIC MODULE

CROSS-REFERENCE TO RELATED APPLICATION

This application is a Continuation-In-Part application under 35 U.S.C. § 120 of U.S. application Ser. No. 16/782,295, which claims priority to and the benefit of Korean Patent Applications No. 2019-0016245, filed Feb. 12, 2019, No. 2020-0007448, filed Jan. 20, 2020 and No. 2020-0015059, filed Feb. 7, 2020 the disclosures of which are incorporated herein by reference in their entirety.

BACKGROUND

1. Field of the Invention

The present invention relates to a thermoelectric module, and more particularly, to a coupling structure of a thermoelectric module.

2. Discussion of Related Art

A thermoelectric effect is a phenomenon which occurs due to movement of electrons and holes in a material and refers to a direct energy conversion between heat and electricity.

Thermoelectric elements are generally referred to as elements using the thermoelectric effect, and the thermoelectric elements have a structure in which a P-type thermoelectric material and an N-type thermoelectric material are bonded between metal electrodes to form PN junction pairs.

The thermoelectric elements may be classified into elements using a change in electrical resistance according to a change in temperature, elements using a Seebeck effect which is a phenomenon in which an electromotive force is generated due to a temperature difference, elements using a Peltier effect which is a phenomenon in which heat absorption or heat emission occurs due to a current, and the like.

The thermoelectric elements have been variously applied to home appliances, electronic components, communication components, and the like. For example, the thermoelectric elements may be applied to cooling apparatuses, heating apparatuses, power generation apparatuses, and the like. Therefore, the demand for thermoelectric performance of the thermoelectric elements is gradually increasing.

The thermoelectric element includes substrates, electrodes, and thermoelectric legs. The plurality of thermoelectric legs are disposed in an array form between an upper substrate and a lower substrate. A plurality of upper electrodes are disposed between the plurality of thermoelectric legs and the upper substrate. A plurality of lower electrodes are disposed between the plurality of thermoelectric legs and the lower substrate.

One of the upper substrate and the lower substrate of the thermoelectric element becomes a high temperature portion, and the other thereof becomes a low temperature portion. In this case, when a temperature difference is generated between the substrate of the high temperature portion and the substrate of the low temperature portion, heat deformation may occur in the substrate of the high temperature portion, and thus, a phenomenon may occur in which stress is concentrated at a bonding interface of the substrate. As a result, delamination and cracking may occur at the bonding interface, which may lower quality of a product.

In particular, an edge of the substrate of the high temperature portion is a portion in which an amount of heat deformation is greater than that of a central portion of the substrate. When edges of the substrate of the high temperature portion and the substrate of the low temperature portion are coupled, stress concentration may be increased at a bonding interface due to heat deformation.

SUMMARY OF THE INVENTION

The present invention is directed to providing a coupling structure of a thermoelectric module.

One aspect of the present invention provides a thermoelectric module including a first metal substrate including a first through-hole, a first insulating layer disposed on the first metal substrate, a first electrode part disposed on the first insulating layer and including a plurality of first electrodes, a plurality of P-type thermoelectric legs and a plurality of N-type thermoelectric legs disposed on the first electrode part, a second electrode part disposed on the plurality of P-type thermoelectric legs and the plurality of N-type thermoelectric legs and including a plurality of second electrodes, a second insulating layer disposed on the second electrode part, and a second metal substrate disposed on the second insulating layer and including a second through-hole, wherein the first metal substrate includes an effective region in which the first electrode part is disposed and a peripheral region formed outside the effective region, the second metal substrate includes an effective region in which the second electrode part is disposed and a peripheral region formed outside the effective region, the first through-hole is disposed in the effective region of the first metal substrate, the second through-hole is disposed in the effective region of the second metal substrate, and the first through-hole and the second through-hole are formed at positions corresponding to each other.

The thermoelectric module may further include a coupling member which passes through the first through-hole and the second through-hole and fixes the first metal substrate and the second metal substrate.

The second metal substrate may be provided as a plurality of second metal substrates spaced apart from each other, and each of the second metal substrates may include at least one second through-hole.

An insulating member may be disposed between the plurality of second metal substrates spaced apart from each other.

A thickness of the insulating member may be smaller than a thickness of the plurality of second metal substrates.

A length direction of some of the plurality of first electrodes disposed on the first metal substrate may be different from a length direction of the remaining first electrodes, and a length direction of some of the plurality of second electrodes disposed on the second metal substrate may be different from a length direction of the remaining second electrodes, wherein each length direction is a long width direction of each electrode.

Excluding the first electrodes of edge regions in the first electrode part, at least two of the plurality of first electrodes may be disposed such that a length direction thereof is directed in a second direction perpendicular to a first direction and the remaining first electrodes may be disposed such that a length direction thereof is directed in the first direction. Excluding the second electrodes of edge regions in the second electrode part, at least two of the plurality of second electrodes may be disposed such that a length direction thereof is directed in the second direction perpendicular to the first direction and the remaining second electrodes may be disposed such that a length direction thereof is directed in the first direction.

Excluding the first electrodes in the edge regions, among the plurality of first electrodes, the number of the first electrodes disposed such that the length direction thereof is directed in the second direction may be a multiple of two, and excluding the second electrodes in the edge regions, among the plurality of second electrodes, the number of the second electrodes disposed such that the length direction thereof is directed in the second direction may be a multiple of two.

Among the plurality of second electrodes, at least some of the second electrodes disposed in two columns or two rows opposite to each other in the edge regions may be disposed such that a length direction thereof is directed in the second direction.

The first metal substrate may include a first hole arrangement region which is a space formed by virtual lines connecting surfaces of the first electrodes which are closest to the first through-hole and are disposed adjacent to each other, the second metal substrate may include a second hole arrangement region which is a space formed by virtual lines connecting surfaces of the second electrodes which are closest to the second through-hole and are disposed adjacent to each other, at least one first electrode adjacent to the first hole arrangement region may be disposed such that a length direction thereof is directed in the second direction, and at least one second electrode adjacent to the second hole arrangement region may be disposed such that a length direction thereof is directed in the second direction.

The first metal substrate may include a first hole arrangement region which is a space formed by virtual lines connecting surfaces of the first electrodes which are closest to the first through-hole and are disposed adjacent to each other, the second metal substrate may include a second hole arrangement region which is a space formed by virtual lines connecting surfaces of the second electrodes which are closest to the second through-hole and are disposed adjacent to each other, the at least two of the plurality of first electrodes may be disposed such that at least a portion thereof overlaps a virtual space formed by extension lines extending from the virtual lines that define the first hole arrangement region, and the at least two of the plurality of first electrodes may be disposed such that at least a portion thereof overlaps a virtual space formed by extension lines extending from the virtual lines that define the second hole arrangement region.

The first through-hole may be provided as a plurality of first through-holes, the first hole arrangement region may be formed around each of the plurality of first through-holes, the second through-hole may be provided as a plurality of second through-holes, and the second hole arrangement region may be formed around each of the plurality of second through-holes.

The plurality of first through-holes and the plurality of second through-holes may be formed at positions corresponding to each other.

The thermoelectric module may further include a third through-hole formed in a peripheral region of the first metal substrate.

A ratio of an area of the second metal substrate to an area of the first metal substrate may range from 0.5 to 0.95.

The thermoelectric module may further include an insulating insertion member disposed adjacent to the coupling member.

A diameter of the first through-hole may be different from a diameter of the second through-hole.

The diameter of the second through-hole may be 1.1 to 2.0 times the diameter of the first through-hole.

A portion of the insulating insertion member may be disposed in the second through-hole.

The thermoelectric module may further include a third insulating layer disposed between the first metal substrate and the first insulating layer.

The other aspect of the present invention provides a power generation apparatus comprising a thermoelectric module and a cooling unit disposed on a surface of the thermoelectric module, wherein the thermoelectric module comprises a first metal substrate including a first through-hole; a first insulating layer disposed on the first metal substrate; a first electrode part disposed on the first insulating layer and including a plurality of first electrodes, a plurality of P-type thermoelectric legs and a plurality of N-type thermoelectric legs disposed on the first electrode part, a second electrode part disposed on the plurality of P-type thermoelectric legs and the plurality of N-type thermoelectric legs and including a plurality of second electrodes, a second insulating layer disposed on the second electrode part and a second metal substrate disposed on the second insulating layer and including a second through-hole, wherein the first metal substrate includes an effective region in which the first electrode part is disposed and a peripheral region formed outside the effective region, the second metal substrate includes an effective region in which the second electrode part is disposed and a peripheral region formed outside the effective region, the first through-hole is disposed in the effective region of the first metal substrate, the second through-hole is disposed in the effective region of the second metal substrate, and the first through-hole and the second through-hole are formed at positions corresponding to each other, wherein the thermoelectric module further comprises a coupling member which passes through the first through-hole and the second through-hole and fixes the first metal substrate and the second metal substrate, wherein the cooling unit is coupled with the first metal substrate, wherein a portion of the coupling member is disposed in the cooling unit.

A temperature of a region related to the first metal substrate may be lower than a temperature of a region related to the second metal substrate.

BRIEF DESCRIPTION OF THE DRAWINGS

The above and other objects, features and advantages of the present invention will become more apparent to those of ordinary skill in the art by describing exemplary embodiments thereof in detail with reference to the attached drawings, in which.

DETAILED DESCRIPTION OF EXEMPLARY EMBODIMENTS

Hereinafter, exemplary embodiments of the present invention will be described in detail with reference to the accompanying drawings.

However, the technical spirit of the present invention is not limited to some exemplary embodiments disclosed below but can be implemented in various different forms. Without departing from the technical spirit of the present invention, one or more of components may be selectively combined and substituted to be used between the exemplary embodiments.

Also, unless defined otherwise, terms (including technical and scientific terms) used herein may be interpreted as having the same meaning as commonly understood by one of ordinary skill in the art to which the present invention belongs. General terms like those defined in a dictionary may be interpreted in consideration of the contextual meaning of the related technology.

Furthermore, the terms used herein are intended to illustrate the exemplary embodiments, but are not intended to limit the present invention.

In the present specification, the terms in singular form may include the plural forms unless otherwise specified. When "at least one (or one or more) of A, B, and C" is expressed, it may include one or more of all possible combinations of A, B, and C.

In addition, terms such as "first," "second," "A," "B," "(a)," and "(b)" may be used herein to describe components of the exemplary embodiments of the present invention.

Each of the terms is not used to define an essence, order, or sequence of a corresponding component but used merely to distinguish the corresponding component from other components.

In a case in which one component is described as being "connected," "coupled" or "joined" to another component, such a description includes both a case in which one component is "connected," "coupled," and "joined" directly to another component and a case in which one component is "connected," "coupled," and "joined" to another component with still another component disposed between one component and another component.

In a case in which any one component is described as being formed or disposed "on (or under)" another component, such a description includes both a case in which the two components are formed to be in direct contact with each other and a case in which the two components are in indirect contact with each other such that one or more other components are interposed between the two components. In addition, in a case in which one component is described as being formed "on (or under)" another component, such a description may include a case in which the one component is formed at an upper side or a lower side with respect to another component.

Figure 1:
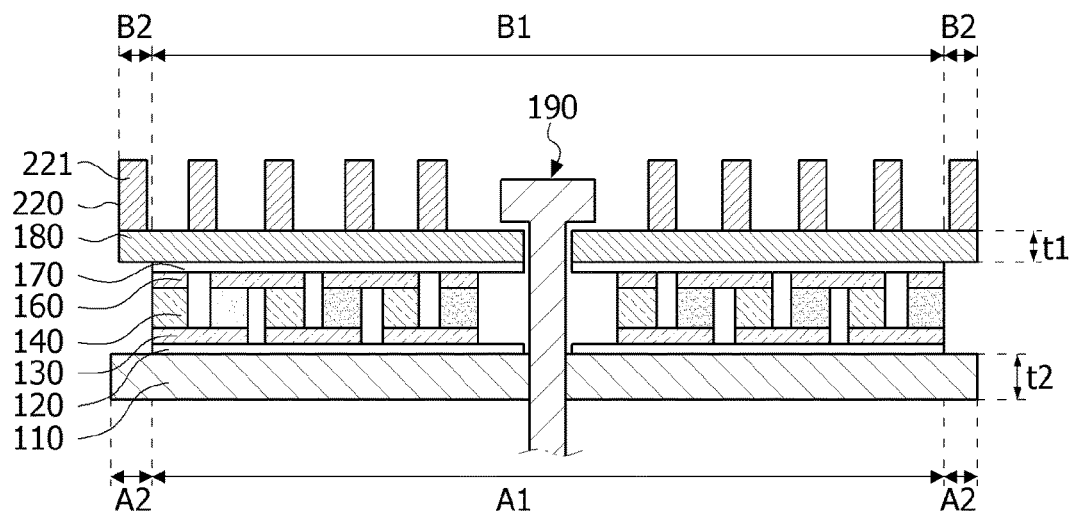
FIG. 1 is a side view of a thermoelectric module according to a first exemplary embodiment of the present invention.
Figure 2:
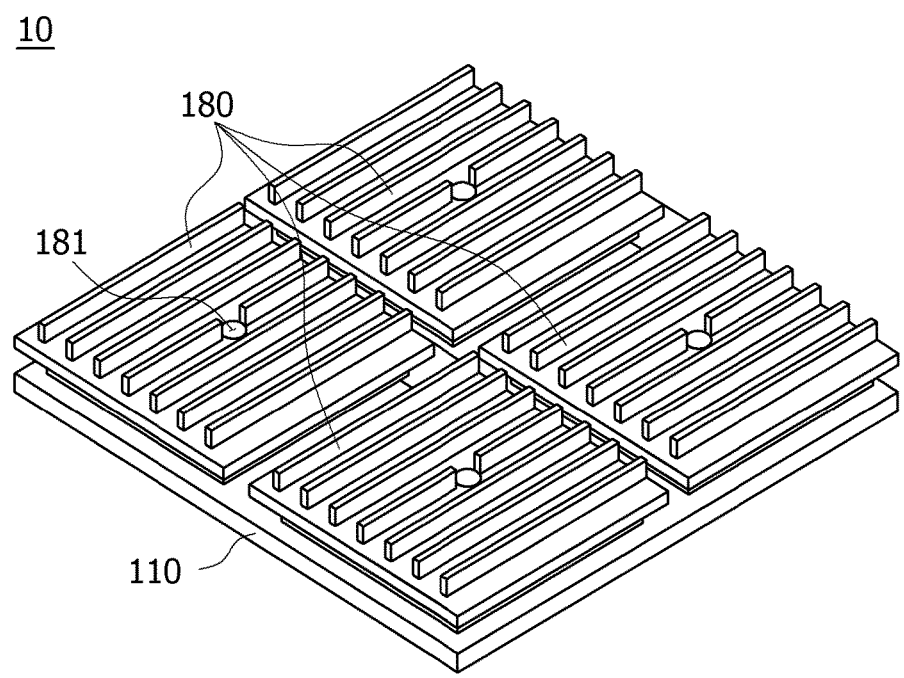
FIG. 2 is a perspective view of the thermoelectric module according to the first exemplary embodiment of the present invention.
Figure 3:
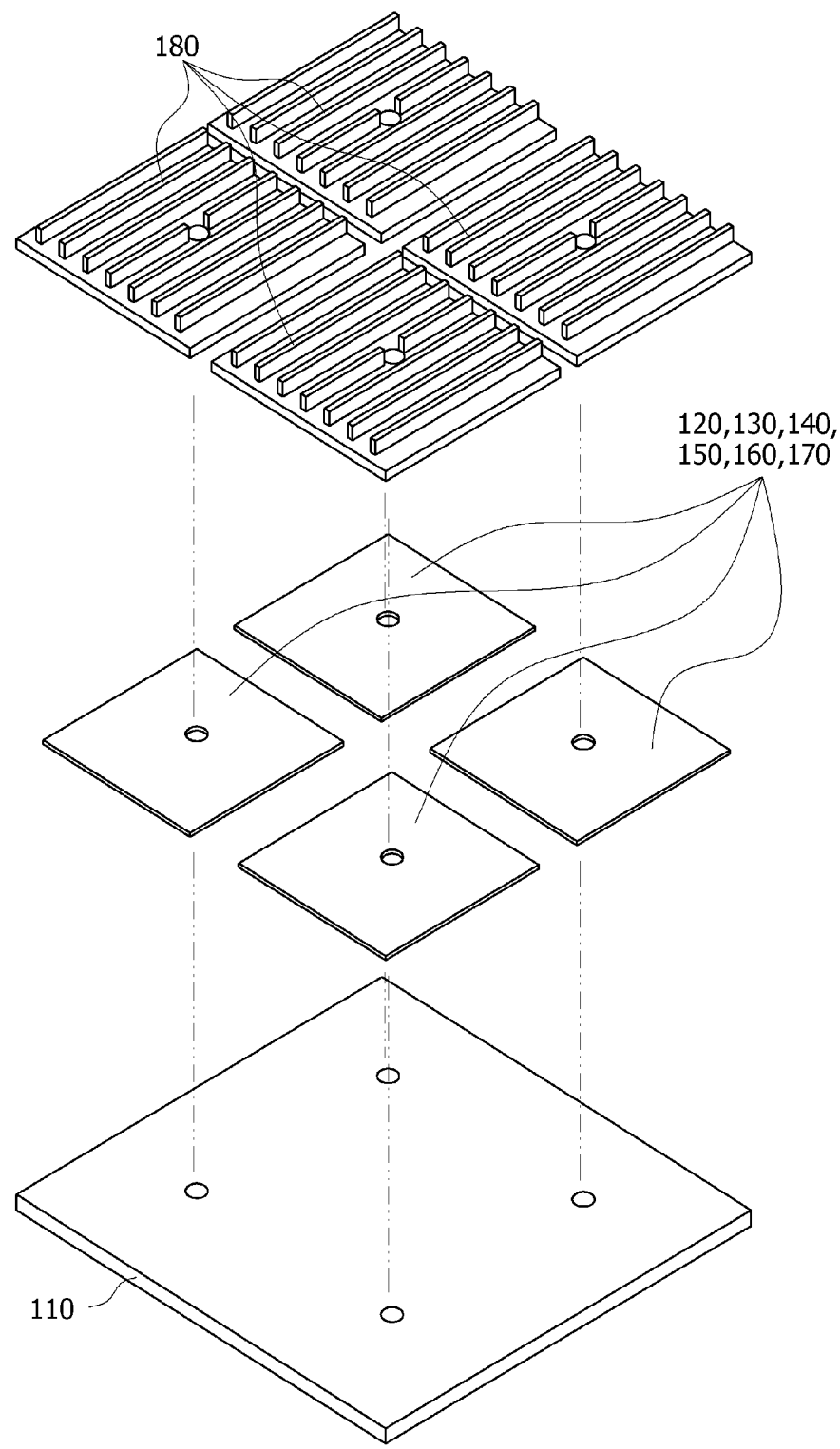
FIG. 3 is an exploded perspective view of the thermoelectric module according to the first exemplary embodiment of the present invention.
Figure 4:
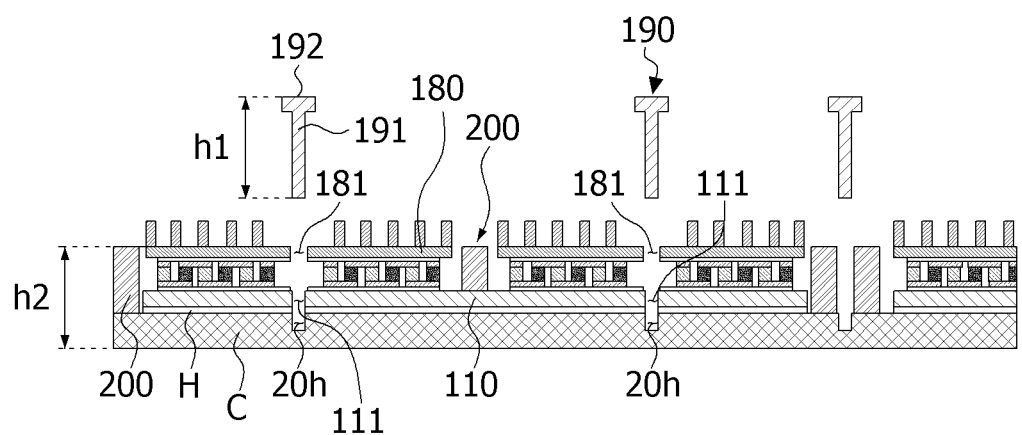
FIG. 4 is a side view illustrating a state in which the thermoelectric module according to the first exemplary embodiment of the present invention is installed in a cooling unit.

FIG. 1 is a side view of a thermoelectric module according to a first exemplary embodiment of the present invention, FIG. 2 is a perspective view of the thermoelectric module according to the first exemplary embodiment of the present invention, and FIG. 3 is an exploded perspective view of the thermoelectric module according to the first exemplary embodiment of the present invention. FIG. 4 is a side view illustrating a state in which the thermoelectric module according to the first exemplary embodiment of the present invention is installed in a cooling unit.

Referring to FIGS. 1 to 4, the thermoelectric module includes one first metal substrate 110, a first resin layer 120, a plurality of first electrodes 130, a plurality of P-type thermoelectric legs 140, a plurality of N-type thermoelectric leg 150, a plurality of second electrodes 160, a second resin layer 170, one second metal substrate 180, a coupling members 190, and a heat insulating material 200. The first metal substrate 110 and the second metal substrate 180 may include at least one through-hole through which the coupling member 190 passes.

According to another exemplary embodiment of the present invention, one thermoelectric module includes one first metal substrate 110 and a plurality of second metal substrates 180 and includes a first resin layer 120, a plurality of first electrodes 130, a plurality of P-type thermoelectric legs 140, a plurality of N-type thermoelectric legs 150, a plurality of second electrodes 160, and a second resin layer 170, which are disposed between the one first metal substrate 110 and the plurality of metal substrates 180. The first metal substrate 110 and the second metal substrate 180 may have at least one through-hole through which the coupling member 190 passes.

The first metal substrate 110 is formed to have a plate shape. In addition, the first metal substrate 110 may be fixed onto a cooling unit C or a heating unit (not shown). Exemplary embodiments according to the present invention will be described as examples in which the first metal substrate 110 is fixed to the cooling unit C. In this case, a hole 20h is formed at a position corresponding to a first through-hole 111 formed in the first metal substrate 110, which is formed in the cooling unit C, and the coupling member 190 to be described below may pass through the first through-hole 111 and be inserted into the hole 20h. As in exemplary embodiments of FIGS. 9 to 11, a third through-hole 113 may be further formed even in a peripheral region of the first metal substrate 110, that is, a region in which the plurality of P-type thermoelectric legs 140 and the plurality of N-type thermoelectric legs 150 are not disposed. In this case, the coupling member 190 may be inserted into the third through-hole 113 and the hole 20h of the cooling unit C formed at a position corresponding to the third through-hole 113. A heat sink pad H may be further disposed between the first metal substrate 110 and the cooling unit C.

The first metal substrate 110 may include at least one selected from among aluminum, an aluminum alloy, copper, and a copper alloy. In this case, when a voltage is applied to the thermoelectric module, the first metal substrate 110 may absorb heat to serve as a low temperature portion, and the second metal substrate 180 may emit heat to serve as a high temperature portion according to a Peltier effect. Meanwhile, when different temperatures are applied to the first metal substrate 110 and the second metal substrate 180, electrons move from a high temperature region to a low temperature region due to a temperature difference to generate a thermoelectromotive force. This is referred to as a Seebeck effect, and electricity is generated in a circuit of the thermoelectric element by the thermoelectromotive force caused by the Seebeck effect.

The first metal substrate 110 includes at least one first through-hole 111. The first through-hole 111 is formed at a position corresponding to a second through-hole 181 formed in the second metal substrate 180 to be described below. The first through-hole 111 may be formed to be spaced a certain distance from a peripheral portion of the first metal substrate 110. In this case, when the coupling member 190 passes through the first through-hole 111 and the second through-hole 181, the first metal substrate 110 and the second metal substrate 180 may be fixed by the coupling member 190. Here, a diameter of the first through-hole 111 formed in a first surface of the first metal substrate 110 in contact with the plurality of first electrodes 130 may be the same as a diameter of the second through-hole 181 formed in a first surface of the second metal substrate 180 in contact with the plurality of second electrodes 160. However, according to an arrangement form, a position, and the like of an insulating insertion member to be described below, the diameter of the first through-hole 111 formed in the first surface of the first metal substrate 110 in contact with the plurality of first electrodes 130 may be different from the diameter of the second through-hole 181 formed in the first surface of the second metal substrate 180 in contact with the plurality of second electrodes 160.

The first resin layer 120 is applied on the first metal substrate 110, and the plurality of first electrodes 130 are disposed thereon.

Here, the first metal substrate 110 may be in direct contact with the first resin layer 120. To this end, surface roughness may be formed on an entirety or portion of a surface of both surfaces of the first metal substrate 110, on which the first resin layer 120 is disposed, that is, the entirety or portion of a surface of the first metal substrate 110, which faces the first resin layer 120. Accordingly, it is possible to prevent a problem that the first resin layer 120 is delaminated when the first metal substrate 110 and the first resin layer 120 are thermocompression-bonded. In the present specification, the surface roughness may mean unevenness and may be used interchangeably with surface coarseness.

The first resin layer 120 and the second resin layer 170 may be made of a resin composition including a resin and an inorganic filler, and the resin may be an epoxy resin or a silicone resin. Here, the inorganic filler may be included in an amount ranging from 68 vol % to 88 vol % of a resin composition. When the inorganic filler is included in an amount less than 68 vol %, a heat conduction effect may be low. When the inorganic filler is included in an amount exceeding 88 vol %, an adhesive force between the resin layer and the metal substrate may be lowered, and the resin layer may be easily broken.

The epoxy resin may include an epoxy compound and a curing agent. In this case, the curing agent may be included at 1 to 10 parts by volume with respect to 10 parts by volume of the epoxy compound. Here, the epoxy compound may include at least one selected from among a crystalline epoxy compound, an amorphous epoxy compound, and a silicone epoxy compound. The crystalline epoxy compound may include a mesogen structure. A mesogen is a basic unit of a liquid crystal and includes a rigid structure. The amorphous epoxy compound may be a conventional amorphous epoxy compound having two or more epoxy groups in a molecule, for example, a glycidyl ether compound derived from bisphenol A or bisphenol F. Here, the curing agent may include at least one selected from among an amine-based curing agent, a phenol-based curing agent, an acid anhydride-based curing agent, a polymercaptan-based curing agent, a polyaminoamide-based curing agent, an isocyanate-based curing agent, and a block isocyanate-based curing agent and may use a mixture of two or more curing agents.

The inorganic filler may include aluminum oxide and a nitride, and the nitride may be included in the inorganic filler in an amount ranging from 55 wt % to 95 wt % and, more preferably, in an amount ranging from 60 wt % to 80 wt %. When the nitride is included in the numerical range, it is possible to increase thermal conductivity and bonding strength. Here, the nitride may include at least one selected from boron nitride and aluminum nitride. Here, the boron nitride may be a boron nitride agglomerate in which plate-shaped boron nitride agglomerates together.

In this case, a particle size (D50) of the boron nitride agglomerate may range from 250 μm to 350 μm, and a particle size (D50) of the aluminum oxide may range from 10 μm to 30 μm. When the particle size (D50) of the boron nitride agglomerate and the particle size (D50) of the aluminum oxide are within such numerical ranges, the boron nitride agglomerate and the aluminum oxide may be uniformly dispersed in an epoxy resin composition, thereby uniformly providing a heat conduction effect and adhesion performance throughout the resin layer.

According to the exemplary embodiments of the present invention, at least one of the first metal substrate 110 and the second metal substrate 180 may include a plurality of resin layers. For example, a third resin layer (not shown) may be further disposed between the first resin layer 120 and the plurality of first electrodes 130. Alternatively, a fourth resin layer (not shown) may be further disposed between the plurality of second electrodes 160 and the second resin layer 170. In this case, the first resin layer 120 and the third resin layer (not shown) may differ in at least one of a composition, a Young's modulus, a thermal expansion coefficient, and a thickness. The second resin layer 170 and the fourth resin layer (not shown) may differ in at least one of a composition, a Young's modulus, a thermal expansion coefficient, and a thickness. For example, when one of the first resin layer 120 and the third resin layer (not shown) includes a resin composition, the other thereof may include a resin composition, an aluminum oxide layer, or a composite including silicon and aluminum, of which at least one of a composition, a Young's modulus, a thermal expansion coefficient, and a thickness is different from that of the one of the first resin layer 120 and the third resin layer. Here, the composite may be at least one selected from among an oxide, a carbide, and a nitride, which include silicon and aluminum. For example, the composite may include at least one of an Al—Si bond, an Al-oxygen (O)—Si bond, a Si—O bond, an Al—Si—O bond, and an Al—O bond. As described above, the composite including at least one of an Al—Si bond, an Al—O—Si bond, a Si—O bond, an Al—Si—O bond, and an Al—O bond may have excellent insulating performance, thereby obtaining high withstand voltage performance. Alternatively, the composite may be an oxide, a carbide, or a nitride, which further includes titanium, zirconium, boron, and zinc in addition to silicon and aluminum. To this end, the composite may be obtained through a process of mixing aluminum with at least one of an inorganic binder and an organic-inorganic mixed binder and then heat-treating the resultant mixture. The inorganic binder may include, for example, at least one selected from among silica ($SiO_2$), a metal alkoxide, boron oxide ($B_2O_3$), and zinc oxide ($ZnO_2$). The inorganic binder may include inorganic particles and may solate or gelate to serve as a binder when coming into contact with water. In this case, at least one selected from among silica ($SiO_2$), a metal alkoxide, and boron oxide ($B_2O_3$) may serve to increase adhesion with a metal, and zinc oxide ($ZnO_2$) may serve to increase strength of the resin layer and increase heat conductivity. In the present specification, the term "withstand voltage performance" may mean a characteristic that is maintained without insulation breakdown for a certain period of time under a certain voltage and a certain current. For example, when a characteristic is maintained for 10 seconds without insulation breakdown under an alternating current (AC) voltage of 2.5 kV and a current of 1 mA, a withstand voltage may be 2.5 kV. Alternatively, when one of the second resin layer 170 and the fourth resin layer (not shown) includes a resin composition, the other thereof may include a resin composition, an aluminum oxide layer, or a composite including silicon and aluminum, of which at least one of a composition, a Young's modulus, a thermal expansion coefficient, and a thickness is different from that of the one of the second resin layer 170 and the fourth resin layer. Here, each resin layer may be used interchangeably with an insulating layer.

The plurality of first electrodes 130 are disposed on the first resin layer 120. The plurality of P-type thermoelectric legs 140 and the plurality of N-type thermoelectric legs 150 are disposed on the first electrodes 130. In this case, the first electrodes 130 are electrically connected to the P-type thermoelectric legs 140 and the N-type thermoelectric legs 150. Here, the first electrode 130 may include at least one selected from among copper (Cu), aluminum (Al), silver (Ag), and nickel (Ni).

The plurality of P-type thermoelectric legs 140 and the plurality of N-type thermoelectric legs 150 are disposed on the first electrodes 130. In this case, the P-type thermoelectric legs 140 and the N-type thermoelectric legs 150 may be bonded to the first electrodes 130 through soldering.

Here, the P-type thermoelectric leg 140 and the N-type thermoelectric leg 150 may be bismuth fluoride (Bi—Te)-based thermoelectric legs including bismuth (Bi) and tellurium (Te) as main raw materials. The P-type thermoelectric leg 140 may be a thermoelectric leg which includes a bismuth fluoride (Bi—Te)-based main raw material at 99 wt % to 99.999 wt % including at least one selected from antimony (Sb), nickel (Ni), aluminum (Al), copper (Cu), silver (Ag), lead (Pb), boron (B), gallium (Ga), tellurium (Te), bismuth (Bi), and indium (In) and a mixture at 0.001 wt % to 1 wt % including Bi or Te with respect to a total weight of 100 wt %. For example, the P-type thermoelectric leg 140 may include Bi—Se—Te as a main raw material and may further include Bi or Te in an amount ranging from 0.001 wt % to 1 wt % with respect to the total weight. The N-type thermoelectric leg 150 may be a thermoelectric leg which includes a bismuth fluoride (Bi—Te)-based main raw material at 99 wt % to 99.999 wt % including at least one selected from selenium (Se), nickel (Ni), aluminum (Al), copper (Cu), silver (Ag), lead (Pb), boron (B), gallium (Ga), tellurium (Te), bismuth (Bi), and indium (In) and a mixture at 0.001 wt % to 1 wt % including Bi or Te with respect to a total weight of 100 wt %. For example, the N-type thermoelectric leg 150 may include Bi—Sb—Te as a main raw material and may further include Bi or Te in an amount ranging from 0.001 wt % to 1 wt % with respect to the total weight.

The P-type thermoelectric leg 140 and the N-type thermoelectric leg 150 may be formed as a bulk type or a stacked type. In general, the bulk P-type thermoelectric leg 140 or the bulk N-type thermoelectric leg 150 may be obtained through a process of heat-treating a thermoelectric material to make an ingot, pulverizing and sieving the ingot to obtain a thermoelectric leg powder, sintering the thermoelectric leg powder, and then cutting the sintered body. The stacked P-type thermoelectric leg 140 or the stacked N-type thermoelectric leg 150 may be obtained through a process of applying a paste including a thermos electric material on a sheet-shaped substrate to form a unit member and then stacking and cutting the unit member.

In this case, a pair of the P-type thermoelectric leg 140 and the N-type thermoelectric leg 150 may have the same shape and volume or may have different shapes and volumes. For example, since the P-type thermoelectric leg 140 and the N-type thermoelectric leg 150 have different electrical conduction characteristics, a height or cross-sectional area of the N-type thermoelectric leg 150 may be different from a height or cross-sectional area of the P-type thermoelectric leg 140.

Performance of a thermoelectric element according to one exemplary embodiment of the present invention may be represented by a thermoelectric performance index. A thermoelectric performance index (ZT) may be represented by Equation 1.

$$ZT = \alpha^2 \cdot \sigma \cdot T / k \qquad \text{[Equation 1]}$$

In Equation 1, α refers to a Seebeck coefficient [V/K], σ refers to electrical conductivity [S/m], and $\alpha^2\sigma$ refers to a power factor [W/mK$^2$]. T refers to a temperature and k refers to thermal conductivity [W/mK]. k may be represented by a·cp·ρ. Here, a refers to thermal diffusivity [cm$^2$/S], cp refers to specific heat [J/gK], and ρ refers to a density [g/cm$^3$].

In order to obtain a thermoelectric performance index of a thermoelectric element, a Z value (V/K) may be measured using a Z meter, and a Seebeck index (ZT) may be calculated using the measured Z value.

The P-type thermoelectric leg 140 or the N-type thermoelectric leg 150 may have a cylindrical shape, a polygonal pillar shape, an elliptical pillar shape, or the like. Alternatively, the P-type thermoelectric leg 140 or the N-type thermoelectric leg 150 may have a stacked structure. For example, a P-type thermoelectric leg or an N-type thermoelectric leg may be formed through a method of stacking a plurality of structures coated with a semiconductor material on a sheet-shaped substrate and cutting the substrate. As a result, it is possible to prevent a loss of a material and improve electrical conduction characteristics.

The plurality of second electrodes 160 are disposed on the plurality of P-type thermoelectric legs 140 and the plurality of N-type thermoelectric legs 150. In this case, the plurality of P-type thermoelectric legs 140 and the plurality of N-type thermoelectric legs 150 may be bonded to the second electrodes 160 through soldering. Here, the second electrode 160 may include at least one selected from among copper (Cu), aluminum (Al), silver (Ag), and nickel (Ni).

The second resin layer 170 is disposed on the plurality of second electrodes 160. The plurality of second metal substrates 180 are disposed on the second resin layer 170.

The second metal substrate 180 is disposed on the second resin layer 170 to face one first metal substrate 110. The second metal substrate 180 may be made of aluminum, an aluminum alloy, copper, or a copper alloy.

The first metal substrate 110 and the second metal substrate 180 may have the same area, and as described above, when the third through-hole 113 is formed in the first metal substrate 110, the area of the first metal substrate 110 may be greater than that of the second metal substrate 180. In this case, a ratio of the area of the second metal substrate 180 to the area of the first metal substrate 110 may range from 0.50 to 0.95, preferably range from 0.60 to 0.90, and more preferably range from 0.70 to 0.85.

In another exemplary embodiment, when the second metal substrate 180 is applied in an application field requiring a relatively larger area or when an influence of heat deformation needs to be further minimized, the second metal substrate 180 may be provided to be divided into a plurality of pieces with respect to one first metal substrate 110. In this case, a ratio of the area of the second metal substrate 180 to the area of the first metal substrate 110 may range from 0.10 to 0.50, preferably range from 0.15 to 0.45, and more preferably range from 0.2 to 0.40. For example, two second metal substrates 180 may be disposed on one first metal substrate 110. Here, the second metal substrates 180 may be disposed to be spaced apart from each other. For example, the first metal substrate 110 may have an area of 100 mm×100 mm, the second metal substrates 180 may each have an area of 45 mm×100 mm, and an interval between the second metal substrates 180 spaced apart from each other may be about 10 mm.

As another example, four second metal substrates 180 may be disposed on one first metal substrate 110. In this case, the second metal substrates 180 may be disposed to be spaced apart from each other. For example, the first metal substrate 110 may have an area of 100 mm×100 mm, the second metal substrates 180 may each have an area of 45 mm×45 mm, and an interval between the second metal substrates 180 spaced apart from each other may be about 10 mm.

As still another example, an interval between the plurality of second metal substrates 180 may be less than 5 mm. For example, the first metal substrate 110 may have an area of 100 mm×100 mm, the second metal substrates 180 may each have an area of 49.5 mm×49.5 mm, and an interval between the plurality of second metal substrates may be about 10 mm. A connection member 230 connecting the plurality of second metal substrates 180 may be formed to have a width of 2 mm.

In this case, the first metal substrate 110 may have a thickness ranging form 0.1 mm to 2 mm. In addition, the second metal substrate 180 may have a thickness that is greater than or equal to the thickness of the first metal substrate 110. When the thickness of the second metal substrate 180 is greater than the thickness of the first metal substrate 110, the thickness of the second metal substrate 180 may be 1.1 to 2.0 times the thickness of the first metal substrate 110. Here, since the second metal substrate 180 is likely to be bent by the coupling member 190, the second metal substrate 180 may be formed to be thicker than first metal substrate 110.

At least one through-hole 181 is formed in the second metal substrate 180. In this case, the second through-hole 181 may be formed to occupy a portion of an effective region B1 which is a region inside a peripheral region B2 of each second metal substrate 180. Here, the effective region may be defined as a region in which the plurality of P-type thermoelectric legs 140 and the plurality of N-type thermoelectric legs 150 capable of substantially implementing a Peltier effect or Seebeck effect are disposed. A terminal electrode may be disposed in the effective region. The terminal electrode may extend from the effective region so as to be connected to an external terminal or wire and may be electrically connected to at least one of the plurality of P-type thermoelectric legs 140 and the plurality of N-type thermoelectric legs 150 or at least one of the plurality of first electrodes 130 and the plurality of second electrodes 160. Each of the plurality of first electrodes 130 and each of the plurality of second electrodes 160 may vertically overlap each other in the effective region. The second through-hole 181 formed in the second metal substrate 180 may be formed to be spaced a certain distance from a peripheral portion of the second metal substrate 180, and when a plurality of second through-holes 181 are formed, the second through-holes 181 may be spaced the same distance from each other from the peripheral portion of the second metal substrate 180. The second through-hole 181 may be formed to overlap the first through-hole 111, and the coupling member 190 may pass through the first through-hole 111 and the second through-hole 181 which correspond to each other. As described above, the coupling member 190 may fix the first metal substrate 110 and the second metal substrate 180 so as to occupy a portion of effective regions A1 and B1 of the first metal substrate 110 and the second metal substrate 180, thereby reducing heat deformation and preventing stress from being concentrated at a bonding portion.

Although not shown, when portions of peripheral regions A2 and B2 of the substrates, that is, edge regions of the substrates are coupled so as not to affect the effective regions A1 and B1 of the first metal substrate 110 and the second metal substrate 180, a fixing force between the substrates may be relatively high. However, in an application field using a Seebeck effect in which a thermoelectric module is exposed to a high temperature environment of 100° C. or more, or in an application field using a Peltier effect in which a heat of 100° C. or more is generated, damage to a thermoelectric module may be caused by a difference between amounts of heat received by a low temperature portion and a high temperature portion. For example, in the case of a thermoelectric module using a Seebeck effect, a substrate of a high temperature portion is expanded by heat, and a substrate of a low temperature portion is shrunk by a separate cooling member so that heat stress is concentrated in edge regions of the substrate. In this case, generated heat stress may be transmitted to electrodes, thermoelectric legs, and resin layers disposed between the substrates, and thus, delamination and cracking may be generated from a weak interface. As a result, thermoelectric efficiency may be rapidly reduced by damage to the thermoelectric module. Although not shown, a sealing member may be further disposed between the first metal substrate 110 and the second metal substrate 180. The sealing member may be disposed on side surfaces of the first electrode 130, the P-type thermoelectric leg 140, the N-type thermoelectric leg 150, and the second electrode 160 between the first metal substrate 110 and the plurality of second metal substrates 180. Accordingly, the first electrode 130, the P-type thermoelectric leg 140, the N-type thermoelectric leg 150, and the second electrode 160 may be sealed from external moisture, heat, and contamination. Here, the sealing member may include a sealing case which is disposed to be spaced a certain distance from side surfaces of an outermost portion of the plurality of first electrodes 130, an outermost portion of the plurality of P-type thermoelectric legs 140 and the plurality of N-type thermoelectric legs 150, and an outermost portion of the plurality of second electrodes 160, a sealing material which is disposed between the sealing case and the first metal substrate 110, and a sealing material which is disposed between the sealing case and the second metal substrate 180. As described above, the sealing case may be in contact with the first metal substrate 110 and the second metal substrate 180 through the sealing materials. Accordingly, when the sealing case is in direct contact with the first metal substrate 110 and the second metal substrate 180, heat conduction may occur through the sealing case, thereby preventing a temperature difference between the first metal substrate 110 and the second metal substrate 180 from being decreased. Here, the sealing material may include at least one selected from an epoxy resin and a silicone resin or may include tape of which both surfaces are coated with at least one selected from an epoxy resin and a silicone resin. The sealing material may serve to seal a gap between the sealing case and the first metal substrate 110 and a gap between the sealing case and the second metal substrate 180, may increase a sealing effect with respect to the first electrode 130, the P-type thermoelectric leg 140, the N-type thermoelectric leg 150, and the second electrode 160 and may be used interchangeably with a finishing material, a finishing layer, a waterproof material, a waterproof layer, and the like. Here, the sealing material sealing the gap between the sealing case and the first metal substrate 110 may be disposed on an upper surface of the first metal substrate 110, and the sealing material sealing the gap between the sealing case and the second metal substrate 180 may be disposed on the side surface of the second metal substrate 180. To this end, the area of the first metal substrate 110 may be greater than the total area of the second metal substrates 180. Meanwhile, the sealing case may have a guide groove through which a lead wire connected to an electrode is drawn out. To this end, the sealing case may be an injection-molded object made of plastic or the like and may be used interchangeably with a sealing cover. However, the above description of the sealing member is merely exemplified, and the sealing member may be modified in various forms. Although not shown, a heat insulating material may be further provided to surround the sealing member. Alternatively, the sealing member may include a heat insulating component.

Figure 7:
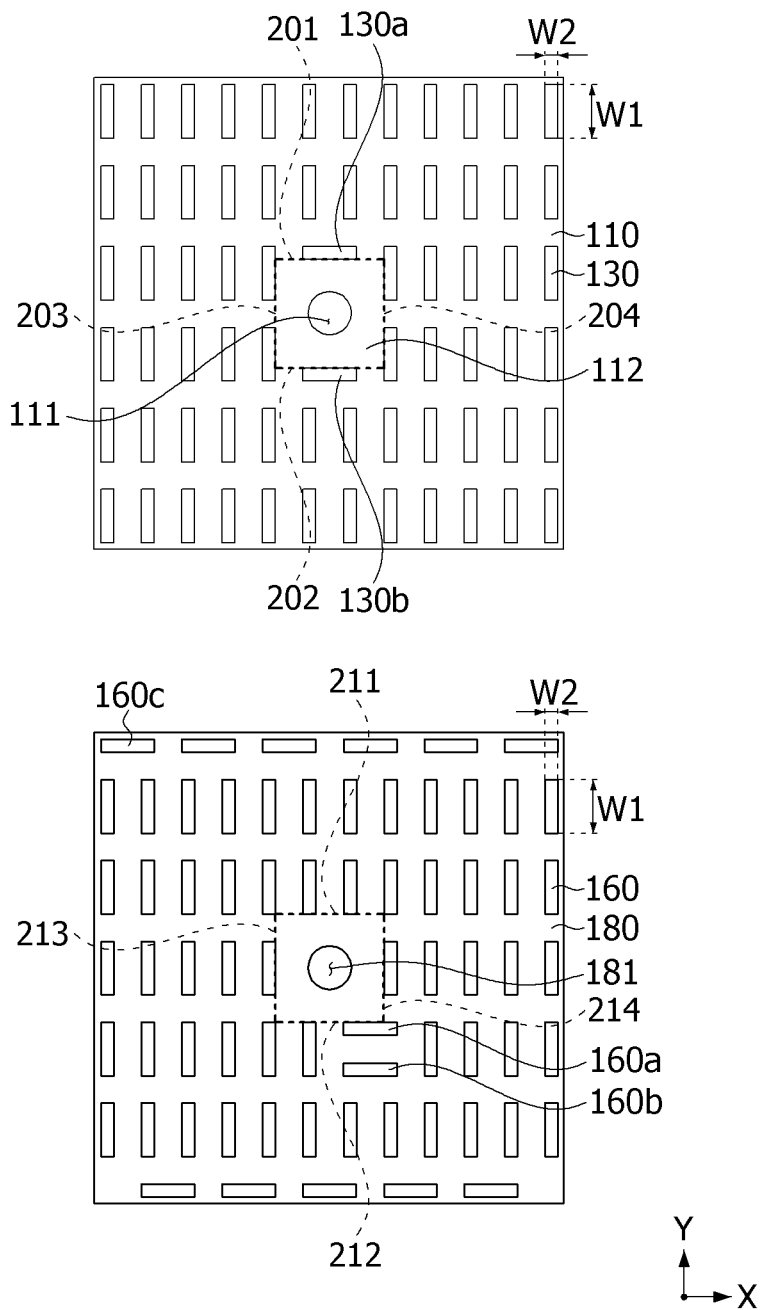
FIG. 7 is a view illustrating a first example of a method of arranging first electrodes and second electrodes on a first metal substrate and a second metal substrate.

Referring to FIG. 7, a first hole arrangement region 112 is formed adjacent to the first through-hole 111 in the first metal substrate 110. The first hole arrangement region 112 may be adjacent to the first through-hole 111 and may be defined as a space formed by virtual lines 201, 202, 203, and 204 which connect surfaces of adjacent electrodes. The first hole arrangement region 112 may be formed to have a polygonal shape, and preferably, may be formed to have a quadrangular shape. In this case, the plurality of first electrodes 130 may not be disposed in the first hole arrangement region 112. In addition, a second hole arrangement region 182 is formed in a surface of the second metal substrate 180, which faces the first metal substrate 110, so as to be adjacent to the second through-hole 181. The second hole arrangement region 182 may be adjacent to the second through-hole 181 and may be defined as a space formed by virtual lines 211, 212, 213, and 214 which connect surfaces of adjacent electrodes. The second hole arrangement region 182 may be formed to have a polygonal shape, and preferably, may be formed to have a quadrangular shape. In this case, the plurality of second electrodes 160 may not be disposed in the second hole arrangement region 182.

The coupling member 190 fixes the first metal substrate 110 and at least one second metal substrate 180. In this case, a portion of the coupling member 190 passes through the second through-hole 181 and the first through-hole 111, and an end portion thereof is insertion-coupled to the hole 20h of the cooling unit C.

Referring to FIG. 4, the coupling member 190 may include a first member 191 and a second member 192. The first member 191 passes through the second through-hole 181 and the first through-hole 111, and one end portion thereof is embedded and fixed in the cooling unit C. In this case, a screw thread may be formed on an outer circumference of the first member 191. The first member 191 may have a diameter that is less than or equal to a diameter of the second through-hole 181 and the first through-hole 111.

The second member 192 may extend from the other end portion of the first member 191 to have a diameter that is greater than the diameter of the second through-hole 181. The second member 192 prevents the second metal substrate 180 from being separated from the first metal substrate 110.

When the plurality of second metal substrates 180 are provided, the heat insulating material 200 may be disposed in a separation space between the plurality of second metal substrates 180. Here, the heat insulating material 200 may include at least one selected from among an epoxy resin, a silicone resin, and ceramic wool, and the heat insulating material 200 may be used interchangeably with the sealing member described above and the connection member 230 to be described below.

A heat sink 220 may be disposed on the second metal substrate 180. For example, the heat sink 220 may be disposed on a surface of both surfaces of the second metal substrate 180, which is opposite to a surface on which the second resin layer 170 is disposed. In this case, the second metal substrate 180 and the heat sink 220 may be integrally formed. Although not shown, a heat sink may be formed on the first metal substrate 110. The heat sinks 220 may have a structure in which a plurality of flat substrates 221 each having a plate shape are disposed to be parallel and air channels are formed in spaces between the flat substrates 221. In this case, an interval between the flat substrates 221 may be less than 10 mm.

Hereinafter, a thermoelectric module 20 according to another exemplary embodiment of the thermoelectric module will be described with reference to FIGS. 5 and 6.

Figure 5:
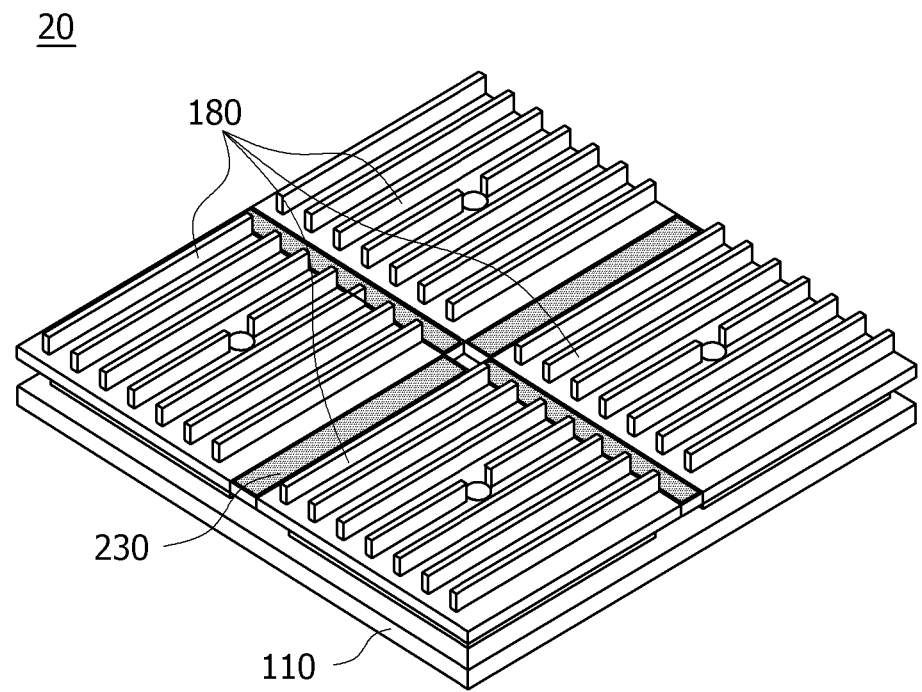
FIG. 5 is a perspective view of a thermoelectric module according to a second exemplary embodiment of the present invention.
Figure 6:
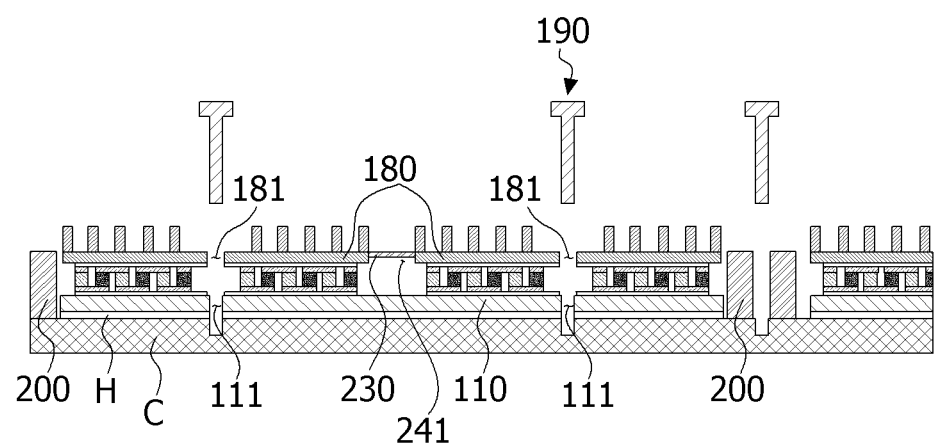
FIG. 6 is a side view illustrating a state in which the thermoelectric module according to the second exemplary embodiment of the present invention is installed in a cooling unit.

FIG. 5 is a perspective view of the thermoelectric module according to a second exemplary embodiment of the present invention, and FIG. 6 is a side view illustrating a state in which the thermoelectric module according to the second exemplary embodiment of the present invention is installed in a cooling unit.

Referring to FIGS. 5 and 6, the thermoelectric module 20 may further include a connection member 230 which connects a plurality of second metal substrates 180.

The connection member 230 may be glue which bonds the plurality of second metal substrates 180. In this case, in the thermoelectric module 20, heat insulating treatment of separation spaces between the plurality of second metal substrates 180 may be omitted, but as described above, a heat insulating material 200 may be disposed between a first metal substrate 110 and the second metal substrate 180.

Although not shown, in the thermoelectric module, the connection member 230 may be omitted, and the plurality of second metal substrates 180 may be connected by an extension member extending from a portion of each of the plurality of second metal substrates 180.

In this case, the extension member may be formed to have a thickness that is less than a thickness of the second metal substrate 180. For example, the second metal substrate 180 may have a thickness ranging from 0.2 mm to 4 mm, and the extension member may have a thickness ranging from 0.1 mm to 2 mm. Here, a ratio of the thickness of the plurality of second metal substrates to the thickness of the extension member may range from 1 to 2.

One surface of the connection member 230 may be further recessed as compared with one surface of the second metal substrate 180 to form a groove 241. In this case, the connection member 230 may be formed to have a cross shape. For example, when the first metal substrate 110 has an area of 100 mm×100 mm and the second metal substrate 180 has an area of 45 mm×45 mm and a thickness ranging from 0.2 mm to 4 mm, the connection member 230 may have a width of 10 mm and a thickness ranging from 0.1 mm to 2 mm, and the groove formed by the connection member 230 may have a depth ranging from 0.1 mm×2 mm. As described above, since the groove is formed due to a thickness difference between the connection member 230 and the second metal substrate 180, a thickness of a central portion of the second metal substrate 180 may be decreased, and thermal deformation of the second metal substrate 180 may be mitigated.

In the present specification, the heat insulating material 200, the connection member 230, and the extension member, which are disposed between the plurality of second metal substrates 180 spaced apart from each other to connect the plurality of second metal substrates 180, may be collectively referred to as a connection member, and the connection member may be an insulating member including an insulating material.

Hereinafter, a method of arranging a plurality of first electrodes 130 and a plurality of second electrodes 160 according to various exemplary embodiments will be described with reference to FIGS. 7 to 11.

Figure 8:
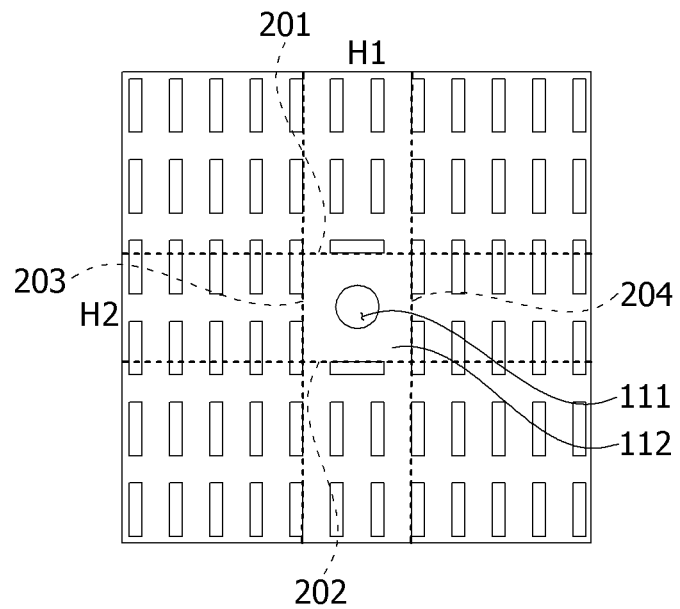
FIG. 8 is a view illustrating a state in which a plurality of first electrodes and a plurality of second electrodes shown in FIG. 7 overlap each other.
Figure 8:
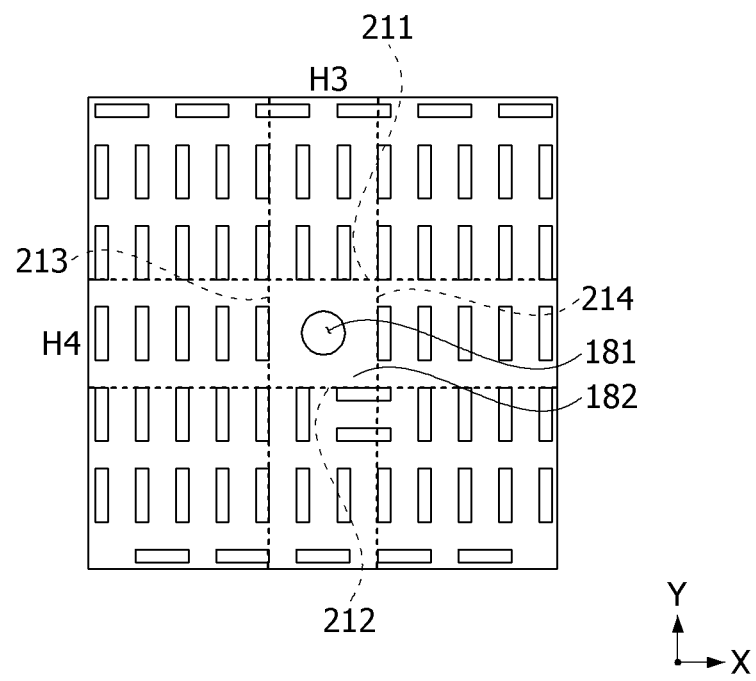
Figure 9:
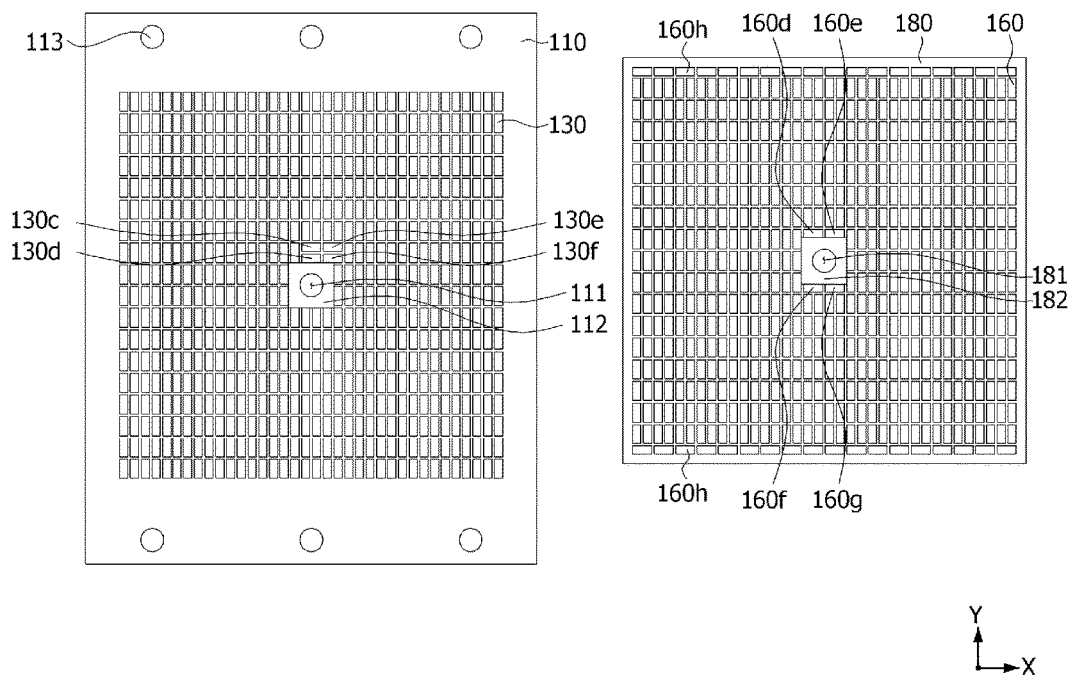
FIGS. 9 to 11 are views illustrating a method of arranging first electrodes and second electrodes on a first metal substrate and a second metal substrate according to various exemplary embodiments.
Figure 10:
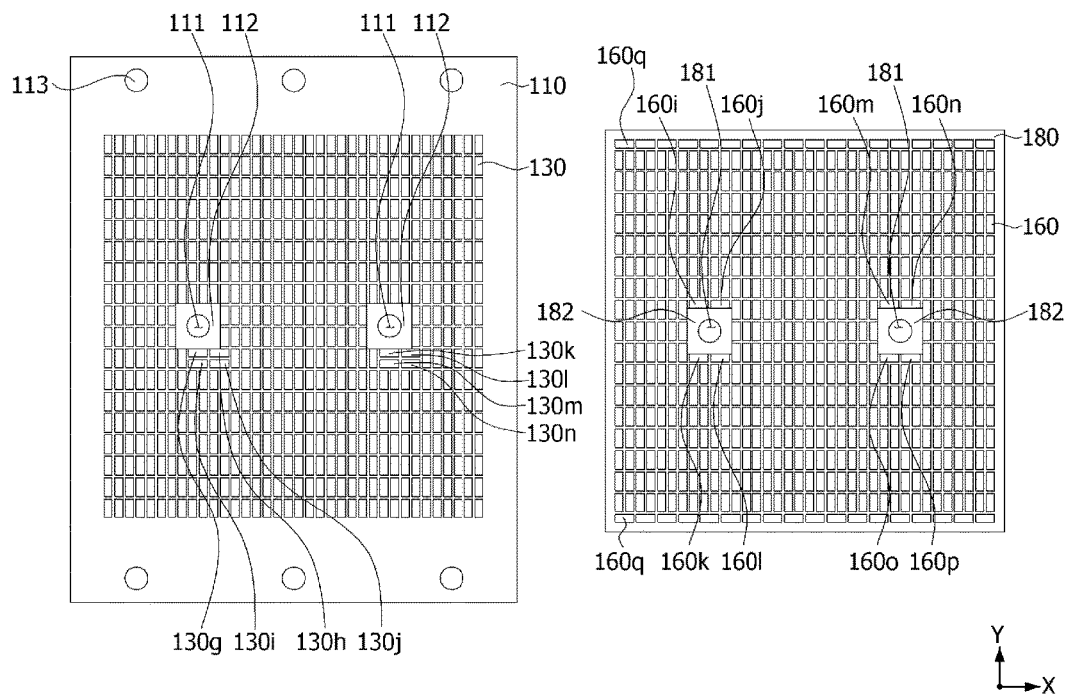
Figure 11:
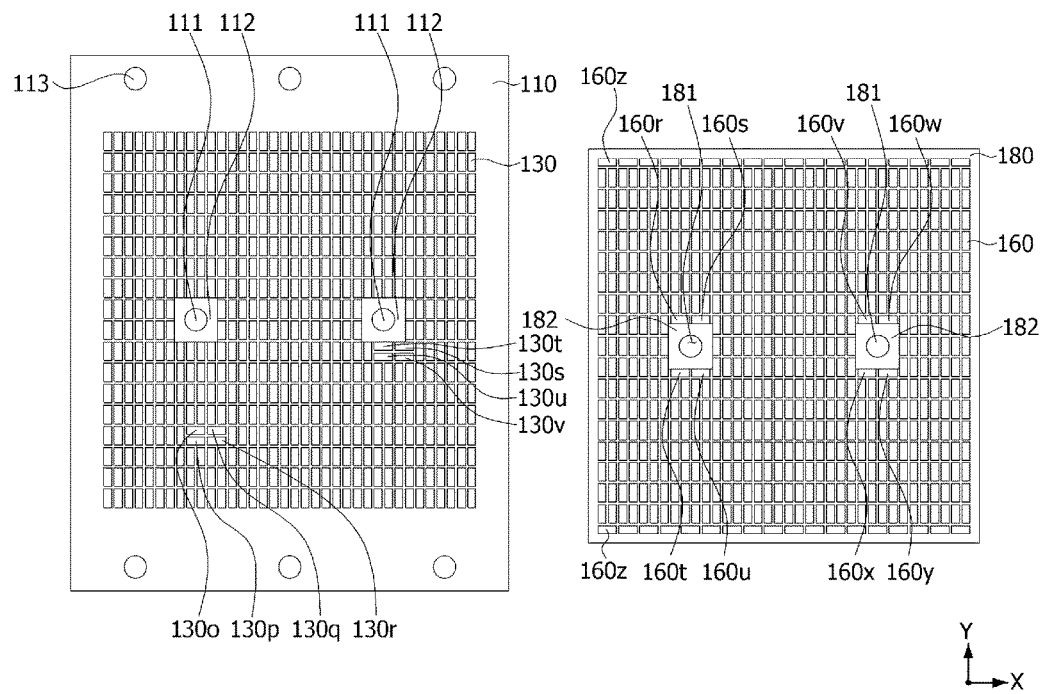

FIG. 7 is a view illustrating a method of arranging the first electrodes and the second electrodes on a first metal substrate 110 and a second metal substrate 180 according to an exemplary embodiment. FIG. 8 is a view illustrating a state in which the plurality of first electrodes and the plurality of second electrodes shown in FIG. 7 overlap each other. FIGS. 9 to 11 are views illustrating a method of arranging the first electrodes and the second electrodes on the first metal substrate 110 and the second metal substrate 180 according to various exemplary embodiments.

Referring to FIGS. 7 to 11, the plurality of first electrodes 130 are disposed on one surface of the first metal substrate 110, which faces the second metal substrate 180, and the plurality of second electrodes 160 are disposed on one surface of the second metal substrate 180 which faces the first metal substrate 110. In this case, the plurality of first electrodes 130 may be disposed on the first metal substrate 110 excluding a first hole arrangement region 112, and the plurality of second electrodes may be disposed on the second metal substrate 180 excluding a second hole arrangement region 182. A position of the first hole arrangement region 112 corresponds to a position of the second hole arrangement region 182.

Here, each of the plurality of first electrodes 130 and the plurality of second electrodes 160 is formed to have a rectangular shape, and a long width W1 and a short width W2 thereof are distinguished from each other. In this case, a ratio of the long width W1 to the short width W2 of the first electrode 130 and the second electrode 160 may vary according to a shape of a leg to be provided. Preferably, the ratio of the long width W1 to the short width W2 of the first electrode 130 and the second electrode 160 may range from 2.05 to 4.50. In the present specification, a direction of the long width may be referred to as a length direction.

Although not shown, when through-holes 111 and 181 are not formed in effective regions of the first metal substrate 110 and the second metal substrate 180, the plurality of first electrodes 130 may all be disposed such that a length direction thereof is directed in a first direction Y. In this case, among the plurality of second electrodes 160, at least some of electrodes disposed in two columns or two rows opposite to each other in edge regions of the effective region may be disposed in a second direction X perpendicular to the first direction Y, and the remaining electrodes may be moved from the plurality of first electrodes 130 by the short width W2 of the electrode so that at least portions thereof may overlap each other. Therefore, a plurality of P-type thermoelectric legs and a plurality of N-type thermoelectric legs between the first metal substrate 110 and the second metal substrate 180 may all be connected in series.

When at least one through-hole 111 or 181 is formed in the effective region of the first metal substrate 110 or the second metal substrate 180 according to the exemplary embodiments of the present invention, among the first electrodes 130 and the plurality of second electrodes 160, the electrodes excluding the electrodes in the edge regions may be disposed such that length directions thereof are mixed in being directed in the first direction Y and the second direction X perpendicular to the first direction Y.

In this case, among the plurality of first electrodes 130 or the plurality of second electrodes 160, excluding the electrodes in the edge regions, at least two electrodes may be disposed in the second direction X perpendicular to the first direction Y, and the remaining electrodes may be disposed in the first direction Y perpendicular to the second direction X.

At least one electrode adjacent to the first hole arrangement region 112 or the second hole arrangement region 182 may be disposed such that a length direction thereof is directed in the second direction X, and another electrode adjacent to the at least one electrode may also be disposed such that a length direction thereof is directed in the second direction X. In this case, the at least two first electrodes 130 and the at least two second electrodes 160 may not overlap each other, or at least portions thereof may overlap each other.

Specifically, at least two first electrodes 130a and 130b of the plurality of first electrodes 130 adjacent to the first hole arrangement region 112 may be disposed such that a length direction thereof is directed in the second direction X. The remaining first electrodes 130 may be disposed such that a length direction thereof is directed in the first direction Y.

In this case, at least two second electrodes 160a and 160b of the plurality of second electrodes 160 adjacent to the second hole arrangement region 182 may be disposed in the second direction X. In addition, two opposite rows of a plurality of second electrodes 160c disposed at edges of the effective region may be disposed such that a length direction thereof is directed in the second direction X. The remaining second electrodes 160 may be disposed such that a length direction thereof is directed in the first direction Y. In this case, the first electrodes 130a and 130b disposed in the second direction X and the second electrodes 160a and 160b disposed in the second direction may not overlap each other or may be disposed such that at least portions thereof overlap each other. Here, the arrangement forms of the plurality of first electrodes 130 and the plurality of second electrodes 160 may be applied interchangeably with each other.

More specifically, as shown in FIG. 8, excluding the first electrodes 130 in the edge regions, at least two of the plurality of first electrodes 130 may be disposed in the second direction X such that at least a portion thereof overlaps a virtual space H1 or H2 formed by extension lines extending from virtual lines 201, 202, 203, and 204 that define the first hole arrangement region 112. Excluding the second electrodes 160 in the edge regions, at least two of the plurality of second electrodes 160 may be disposed in the second direction X such that at least a portion thereof overlaps a virtual space H3 or H4 formed by extension lines extending from virtual lines 211, 212, 213, and 214 that define the second hole arrangement region 182. Therefore, the plurality of P-type and the plurality of N-type thermoelectric legs may be optimally disposed in a limited space in which each hole arrangement region is formed. Here, the number of the electrodes disposed in the second direction X may be increased according to the number, position, and shape of the first hole arrangement region 112 and the second hole arrangement region 182. In this case, the number of the electrodes disposed in the second direction X may be a multiple of two, and at least two of the electrodes disposed in the second direction X may be disposed such that at least a portion therefore overlaps the space H1 or H4.

In the present specification, the electrode arrangement forms of the plurality of first electrodes 130 and the plurality of second electrodes 160 may be applied interchangeably with each other, and the first direction Y and the second direction X are not limited thereto.

Referring to FIG. 9, among the plurality of first electrodes 130, two first electrodes 130d and 130f adjacent to the first hole arrangement region 112 may be disposed such that a length direction thereof is directed in the second direction X, and two first electrodes 130c and 130e adjacent to the two first electrodes 130d and 130f may also be disposed in the second direction X such that length directions thereof are the same. The remaining first electrodes 130 may be disposed such that a length direction thereof is directed in the first direction Y.

In this case, among the plurality of second electrodes 160, two second electrodes 160d and 160e adjacent to the second hole arrangement region 182 may be disposed such that a length direction thereof is directed in the second direction X, and other two second electrodes 160f and 160g adjacent to the second hole arrangement region 182 may also be disposed in the second direction X such that length directions thereof are the same. In addition, second electrodes 160h disposed in two rows opposite to each other in edge regions may be disposed such that a length direction thereof is directed in the second direction. The remaining second electrodes 160 may be disposed such that a length direction thereof is directed in the first direction Y.

Referring to FIG. 10, a plurality of first through-holes 111 and a plurality of second through-holes 181 may be formed in the first metal substrate 110 and the second metal substrate 180. Accordingly, a plurality of first hole arrangement regions 112 and a plurality of second hole arrangement regions 182 may also be formed. In this case, among the plurality of first electrodes 130, two first electrodes 130g and 130h adjacent to the first hole arrangement region 112 may be disposed such that a length direction thereof is directed in the second direction X, and two first electrodes 130g and 130j adjacent to the two first electrodes 130g and 130h may also be disposed in the second direction X such that length directions thereof are the same. In this case, the plurality of first hole arrangement regions 112 may be formed, and a multiple of two of the plurality of first electrodes 130 may be disposed to face the second direction X. More specifically, at least eight first electrodes 130g to 130n among the plurality of first electrodes 130 may be disposed to face the second direction X. In addition, the remaining first electrodes 130 may be disposed such that a length direction thereof is directed in the first direction Y.

In this case, among the plurality of second electrodes 160, two second electrodes 160i and 160j adjacent to the second hole arrangement region 182 in the first direction Y may be disposed such that a length direction thereof is directed in the second direction X, and other two second electrodes 160k and 160l adjacent to the second hole arrangement region 182 may also be disposed in the second direction X such that length directions thereof are the same Here, the plurality of second hole arrangement regions 182 may be formed, and a multiple of two of the plurality of second electrodes 160 may be disposed such that a length direction thereof is directed in the second direction X. More specifically, at least eight second electrodes 160i to 160p among the plurality of second electrodes 160 may be disposed such that a length direction thereof is directed in the second direction X. In addition, second electrodes 160g disposed in two rows opposite to each other in edge regions may also be disposed such that a length direction thereof is directed in the second direction X. Furthermore, the remaining second electrodes 160 may be disposed such that a length direction thereof is directed in the first direction Y.

Referring to FIG. 11, a plurality of first hole arrangement regions 112 may be formed, and four first electrodes 130o to 130r among the plurality of first electrodes 130, which are spaced apart from one first hole arrangement region 112, may be disposed such that a length direction thereof is directed in the second direction X. Here, a plurality of electrodes may be disposed between the first hole arrangement region 112 and the first electrodes 130o to 130r. On the other hand, the first electrodes 130o to 130r may be disposed in the second direction X such that at least a portion thereof overlaps a virtual space formed by extension lines extending from virtual lines that define the first hole arrangement region 112. In addition, four first electrodes 130s to 130v among the plurality of first electrodes 130, which are adjacent to another first hole arrangement region 112 in the first direction, may be disposed in the second direction X In this case, four second electrodes 160r to 160u and four second electrodes 160v to 160y among the second electrodes 160, which are adjacent to the second hole arrangement regions 182, may be disposed such that a length direction thereof is directed in the second direction X.

Figure 12:
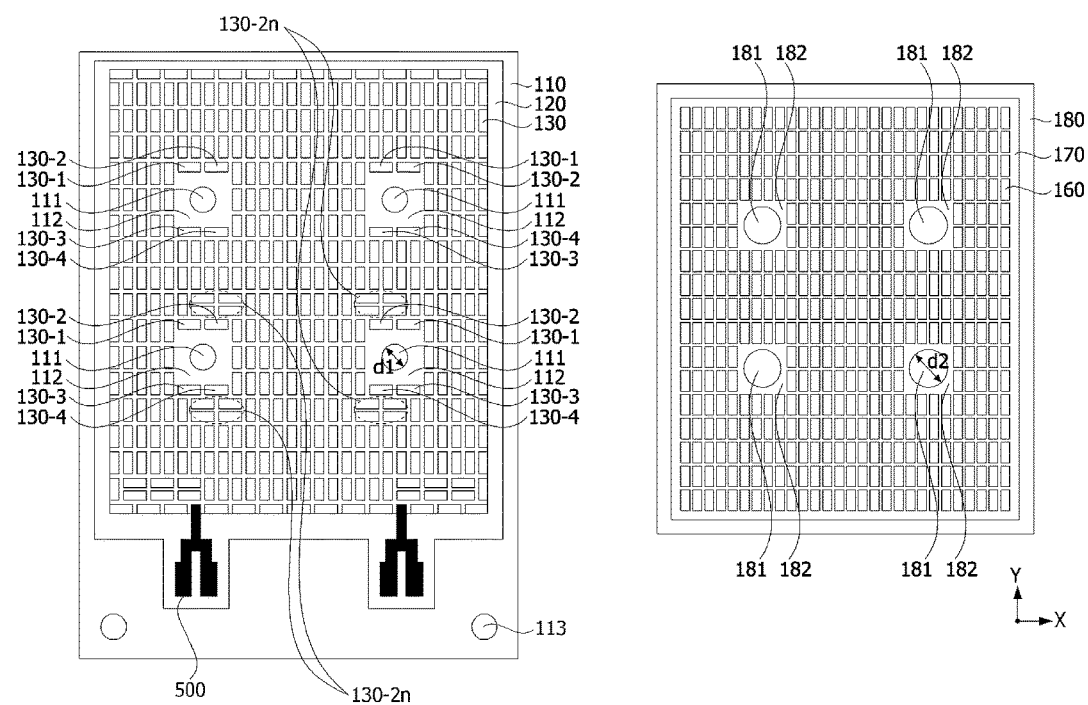

Referring to FIG. 12, a plurality of first through-holes 111 and a plurality of second through-holes 181 may be formed in the first metal substrate 110 and the second metal substrate 180. Accordingly, a plurality of first hole arrangement regions 112 and a plurality of second hole arrangement regions 182 may also be formed. For example, the first metal substrate 110 may include four first through-holes 111 and four first hole arrangement regions 112, and the second metal substrate 180 may include four second through-holes 181 and four second hole arrangement regions 182.

In this case, among the plurality of first electrodes 130, two first electrodes 130-1 and 130-2 adjacent to each first hole arrangement region 112 may be disposed such that a length direction thereof is directed in the second direction X. In addition, other two first electrodes 130-3 and 130-4 adjacent to each first hole arrangement region 112 may also be disposed such that a length direction thereof is directed in the second direction X. Accordingly, a multiple of two of the plurality of first electrodes 130 may be disposed to face the second direction X. More specifically, at least 16 first electrodes 130-1 to 130-4 among the plurality of first electrodes 130 may be disposed to face the second direction X. In addition, the remaining first electrodes 130 may be disposed such that a length direction thereof is directed in the first direction Y.

Furthermore, $2n$ first electrodes 130-$2n$, which are adjacent to at least one of the four first electrodes 130-1 to 130-4 disposed adjacent to any one of the first hole arrangement regions 112 so as to face the second direction X, may also be disposed such that a length direction thereof is directed in the second direction X (wherein n is an integer of one or more). Here, a position at which the $2n$ first electrodes 130-$2n$ are disposed may be variously changed according to an arrangement structure of the plurality of second electrodes 160.

In addition, a plurality of electrodes may be disposed between the first hole arrangement region 112 and the $2n$ first electrodes 130-$2n$. On the other hand, the $2n$ first electrodes 130-$2n$ may be disposed in the second direction X such that at least a portion thereof overlaps a virtual space formed by extension lines extending from virtual lines that define the first hole arrangement region 112.

In FIG. 12, the $2n$ first electrodes 130-$2n$ are illustrated as being disposed in the second direction X, but the present invention is not limited thereto, and $2n$ second electrodes may be disposed in the first direction Y.

A first resin layer 120 disposed between the first metal substrate 110 and the plurality of first electrodes 130 and a second resin layer 170 disposed between the second metal substrate 180 and the plurality of second electrodes 160 are illustrated only in FIG. 12, but the present invention is not limited thereto. The first resin layer 120 and the second resin layer 170 are omitted in the exemplary embodiment of FIGS. 7 to 11 for convenience of description, and the first resin layer 120 and the second resin layer 170 having the same or similar structure may also be applied in the exemplary embodiments of FIGS. 7 to 11.

Similarly, a terminal electrode 500 is illustrated in only FIG. 12, but the present invention is not limited thereto. The terminal electrode 500 having the same or similar structure may also be applied in the exemplary embodiments of FIGS. 7 to 11.

As shown in FIGS. 7 to 12, two rows disposed in the second direction X so as to be opposite to each other in edge regions may be included in the first electrode 130 disposed on the first metal substrate 110 or may be included in the second electrode 160 disposed on the second metal substrate 180.

In this case, a diameter d1 of the first through-hole 111 formed in a first surface of the first metal substrate 110 in contact with the plurality of first electrodes 130 may be the same as a diameter d2 of the second through-hole 181 formed in a first surface of the second metal substrate 180 in contact with the plurality of second electrodes 160. However, the diameter d1 of the first through-hole 111 formed in the first surface of the first metal substrate 110 in contact with the plurality of first electrodes 130 may be different from the diameter d2 of the second through-hole 181 formed in the first surface of the second metal substrate 180 in contact with the plurality of second electrodes 160 according to the arrangement form, position, and the like of an insulating insertion member to be described below.

Meanwhile, as shown in FIGS. 7 to 12, an area of the first hole arrangement region 112 may be four times or more, preferably six times or more, and more preferably eight times or more an area of one first electrode 130. When the area of the first hole arrangement region 112 is less than four times the area of one first electrode 130, a current may flow to the first metal substrate 110 through the first through hole 111 at a high AC voltage of 1 kV or more which may cause electrical breakdown of the first metal substrate 110. Therefore, in an application field at a high voltage, in order to prevent electrical breakdown of a thermoelectric module, it is important to secure a sufficient insulation distance. When the area of the first hole arrangement region 112 is eight times or more the area of one first electrode 130, electrical breakdown does not occur even at a high AC voltage of 2.5 kV or more. Similarly, an area of the second hole arrangement region 182 formed in the second metal substrate 180 may be four times or more, preferably six times or more, and more preferably eight times or more an area of one second electrode 160.

In addition, as shown in FIGS. 7 to 12, among the plurality of first electrodes 130, all electrodes disposed closest to a first edge (not shown) of the first metal substrate 110 may be periodically disposed and may be disposed such that a path between a start point and an end point of a virtual line connecting surfaces of the electrodes disposed closest to the first edge of the first metal substrate 110 is a straight line which has no bent region. That is, this may mean that, among surfaces of four electrodes of all the first electrodes 130 closest to the first edge of the first metal substrate 110, surfaces of the electrodes closest to the first edge of the first metal substrate 110 are disposed to have no removed region and to be spaced the same interval from the first edge of the first metal substrate 110 in one direction. For example, this may mean that, when the path between the start point and the end point of the virtual line connecting the surfaces of the electrodes disposed closest to the first edge of the first metal substrate 110 is a straight line, among the plurality of first electrodes 130, all the electrodes in a first column (not shown) are periodically disposed. Accordingly, when the plurality of first electrodes 130 are disposed on the first metal substrate 110, it is possible to reduce complexity of a process, and it is possible to simplify arrangement structures of the second electrodes 160 disposed on the second metal substrate 180 and the thermoelectric legs disposed between the second electrodes 160 and the first electrodes 130. In addition, since the shortest distance between the edge of the first metal substrate 110 and the first electrodes 130 disposed closest to the edge of the first metal substrate 110 may be maintained to be constant, the first electrodes 130 disposed closest to the edge of the first metal substrate 110 may have uniform electrical characteristics.

When the path between the start point and the end point of the virtual line connecting the surfaces of the electrodes disposed closest to the first edge of the first metal substrate 110 includes a bent region, this may mean that some of the electrodes in the first column among the plurality of first electrodes 130 are removed or include recessed regions and thus periodicity of an arrangement is lost. A surface of the electrode disposed closest to the first edge of the first metal substrate 110 in the bent region may be a surface of the electrode disposed in a second column (not shown) subsequent to the first column. Here, the second column may be a column disposed farther from the first edge of the first metal substrate 110 than the first column and may not be an outermost column. The first electrodes 130 may be disposed to include a bent region in order to additionally arrange a through-hole. However, in this case, as described above, in an application field at a high voltage, a sufficient insulation distance may not be secured to cause electrical breakdown of a thermoelectric module, or an effective region of a first electrode part may be reduced, resulting in a reduction in efficiency of the thermoelectric module.

Similarly, all the electrodes (in an $N^{th}$ column) closest to a second edge (not shown) facing the first edge of the first metal substrate 110 among the plurality of first electrodes 130, the electrodes (in a first row) closest to a third edge (not shown) between the first edge and the second edge of the first metal substrate 110 among the plurality of first electrodes 130, and the electrodes (in an $M^{th}$ row) closest to a fourth edge (not shown) facing the third edge of the first metal substrate 110 among the plurality of first electrodes 130 may be disposed such that a path between a start point and an end point of a virtual line connecting surfaces of the electrodes disposed closest to each edge is a straight line which has no bent region. However, only any one of outermost columns or outermost rows, for example, only any one of the first column, the $N^{th}$ column, the first row, and the $M^{th}$ row may have an exceptional path according to a design such as a terminal electrode arrangement. For example, a terminal electrode may be connected to the first electrode 130 disposed in any one of the first column, the $N^{th}$ column, the first row, and the $M^{th}$ row which are the outermost columns or the outermost rows or may extend from the first electrode 130 disposed in any one of the first column, the $N^{th}$ column, the first row, and the $M^{th}$ row. Therefore, among the outermost columns and the outermost rows, excluding one column or row in which the terminal electrode is disposed, the remaining columns or rows may be disposed to be spaced a certain interval from corresponding edges of the first metal substrate 110.

Figure 13:
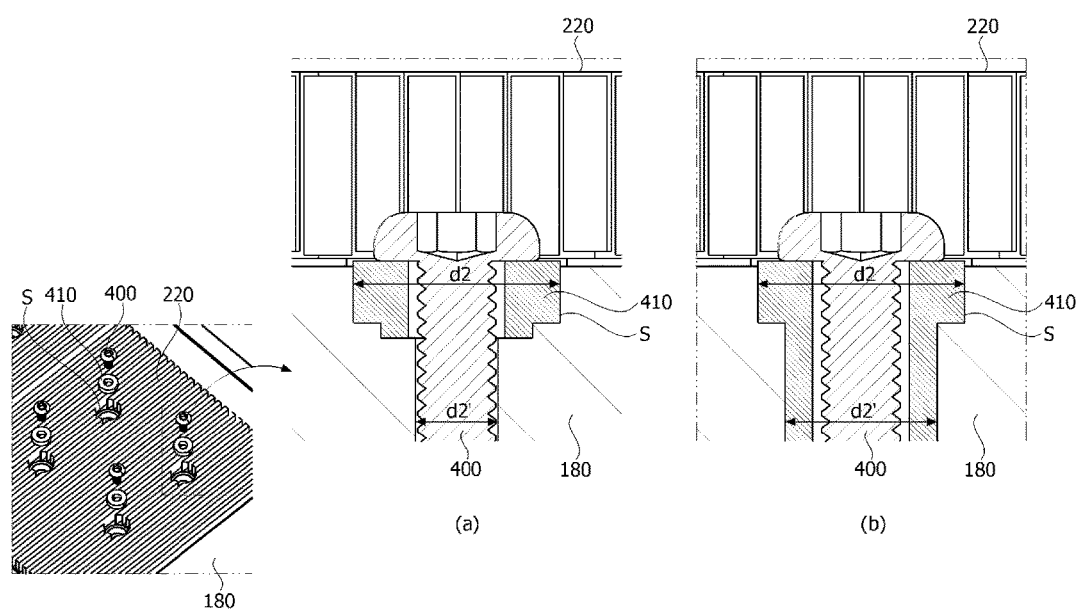
FIG. 13 is a set of views illustrating a coupling structure of a thermoelectric element according to an exemplary embodiment.

FIG. 13 illustrates a coupling structure of a thermoelectric element according to an exemplary embodiment of the present invention.

Referring to FIG. 13, a thermoelectric element 100 may be coupled using a plurality of coupling members 400. The plurality of coupling members 400 may connect a heat sink 220 and a second metal substrate 180, connect the heat sink 220, the second metal substrate 180, and a first metal substrate (not shown), connect the heat sink 220, the second metal substrate 180, the first metal substrate (not shown), and a cooling unit (not shown), connect the second metal substrate 180, the first metal substrate (not shown), and the cooling unit (not shown), or connect the second metal substrate 180 and the first metal substrate (not shown).

To this end, through-holes S, through which the coupling member 400 passes, may be formed in the heat sink 220, the second metal substrate 180, the first metal substrate (not shown), and the cooling unit (not shown). Here, the through-hole S may include the second through-hole 181 and the first through-hole 111. Here, a separate insulating insertion member 410 may be further disposed between the second through-hole 181 and the coupling member 400. The separate insulating insertion member 410 may be an insulating insertion member surrounding an outer circumferential surface of the coupling member 400 or an insulating insertion member surrounding a wall surface of the through-hole S. Accordingly, it is possible to increase an insulation distance of the thermoelectric element.

Meanwhile, the shapes of the insulating insertion member 410 may be the same as those illustrated in FIGS. 13A and 13B. For example, as shown in FIG. 13A, a stepped portion may be formed in a region of the through-hole S formed in the second metal substrate 180 so that the insulating insertion member 410 may be disposed to surround a portion of a wall surface of the through-hole S. Alternatively, a stepped portion may be formed in the region of the through-hole S formed in the second metal substrate 180 so that the insulating insertion member 410 may be disposed to extend to a first surface of the second metal substrate 18, on which a second electrode (not shown) is disposed, along the wall surface of the through-hole S.

Referring to FIG. 13A, a diameter d2' of the through-hole S formed in the first surface of the second metal substrate 180 in contact with the second electrode may be the same as a diameter of a through-hole formed in a first surface of the first metal substrate in contact with a first electrode. In this case, the diameter d2' of the through-hole S formed in the first surface of the second metal substrate 180 may be different from a diameter d2 of the through-hole S formed in a second surface that is a surface opposite to the first surface according to the shape of the insulating insertion member 410. Although not shown, when a stepped portion is not formed in the region of the through-hole S and the insulating insertion member 410 is disposed only on a portion of an upper surface of the second metal substrate 180 or is disposed to extend to a portion or entirety of the wall surface of the through-hole S from the upper surface of the second metal substrate 180, the diameter d2' of the through-hole S formed in the first surface of the second metal substrate 180 may be the same as the diameter d2 of the through-hole S formed in the second surface that is a surface opposite to the first surface.

Referring to FIG. 13B, due to the shape of the insulating insertion member 410, the diameter d2' of the through-hole S formed in the first surface of the second metal substrate 180 in contact with the second electrode may be greater than the diameter of the through-hole formed in the first surface of the first metal substrate in contact with the first electrode. In this case, the diameter d2' of the through-hole S formed in the first surface of the second metal substrate 180 may be 1.1 to 2.0 times the diameter of the through-hole formed in the first surface of the first metal substrate. When the diameter d2' of the through-hole S formed in the first surface of the second metal substrate 180 is less than 1.1 times the diameter of the through-hole of the first surface formed in the first metal substrate, an insulating effect of the insulation insertion member 410 may be insignificant, which may cause insulation breakdown of the thermoelectric element. When the diameter d2' of the through-hole S formed in the first surface of the second metal substrate 180 exceeds 2.0 times the diameter of the through-hole formed in the first surface of the first metal substrate, a size of a region occupied by the through-hole S may be relatively increased, which may reduce an effective area of the second metal substrate 180 and may lower efficiency of the thermoelectric element.

Due to the shape of the insulating insertion member 410, the diameter d2' of the through-hole S formed in the first surface of the second metal substrate 180 may be different from the diameter of the through-hole S formed in the second surface that is a surface opposite to the first surface. As described above, when a stepped portion is not formed in the region of the through-hole S of the second metal substrate 180, the diameter d2' of the through-hole S formed in the first surface of the second metal substrate 180 may be the same as the diameter d2 of the through-hole S formed in the second surface that is a surface opposite to the first surface.

According to the exemplary embodiments of the present invention, among the first electrodes 130 or the second electrodes 160, even when electrodes are spaced apart from the first hole arrangement region 112 or the second hole arrangement region 182, at least two electrodes may be disposed in the second direction X such that at least a portion thereof overlaps a virtual space formed by extension lines extending from virtual lines that define each hole arrangement region, and a plurality of P-type thermoelectric legs and a plurality of N-type thermoelectric legs may be optimally disposed without waste of space in a limited space in which each hole arrangement region is formed.

The thermoelectric element according to the exemplary embodiments of the present invention may be applied to power generation apparatuses, cooling apparatuses, heating apparatuses, and the like. Specifically, the thermoelectric element according to the exemplary embodiments of the present invention may be mainly applied to optical communication modules, sensors, medical instruments, measuring instruments, aerospace industrial fields, refrigerators, chillers, automotive ventilation sheets, cup holders, washers, dryers, wine cellars, water purifiers, sensor power supplies, thermopiles, and the like.

Here, as an example in which the thermoelectric element according to the exemplary embodiments of the present invention is applied to medical instruments, there are polymerase chain reaction (PCR) instruments. The PCR instrument is an apparatus, in which deoxyribonucleic acid (DNA) is amplified to determine a sequence of DNA, requiring precise temperature control and a thermal cycle. To this end, a Peltier-based thermoelectric element can be applied thereto.

As another example in which the thermoelectric element according to the exemplary embodiments of the present invention is applied to medical instruments, there are photodetectors. Here, the photodetectors include infrared/ultraviolet detectors, charge coupled device (CCD) sensors, X-ray detectors, and thermoelectric thermal reference sources (TTRS). The Peltier-based thermoelectric element may be applied for cooling the photodetector. Accordingly, a change in wavelength and decreases in output power and resolution due to an increase in temperature in the photodetector can be prevented.

As still another example in which the thermoelectric element according to the exemplary embodiments of the present invention is applied to medical instruments, there are an immunoassay field, an in vitro diagnostic field, temperature control and cooling systems, a physiotherapy field, liquid chiller systems, a blood/plasma temperature control field, and the like. Accordingly, a temperature can be precisely controlled.

As yet another example in which the thermoelectric element according to the exemplary embodiments of the present invention is applied to medical instruments, there are artificial hearts. Accordingly, power can be supplied to the artificial heart.

As an example in which the thermoelectric element according to the exemplary embodiments of the present invention is applied to an aerospace industrial field, there are star tracking systems, thermal imaging cameras, infrared/ultraviolet detectors, CCD sensors, the Hubble space telescope, TTRS, and the like. Accordingly, a temperature of an image sensor can be maintained.

As another example in which the thermoelectric element according to the exemplary embodiments of the present invention is applied to an aerospace industrial field, there are cooling apparatuses, heaters, power generation apparatuses, and the like.

In addition, the thermoelectric element according to the exemplary embodiments of the present invention may be applied to other industrial fields for power generation, cooling, and heating.

According to the exemplary embodiments of the present invention, since a substrate of a high temperature portion and a substrate of a low temperature portion are coupled such that portions of effective regions thereof are occupied to each other, it is possible to reduce thermal deformation of the substrate of the high temperature portion and to prevent stress from being concentrated at a bonding portion, thereby increasing reliability and durability of a thermoelectric module.

According to the exemplary embodiments of the present invention, a plurality of P-type thermoelectric legs and a plurality of N-type thermoelectric legs can be optimally disposed without waste of space in a limited space in which each hole arrangement region is formed, thereby maintaining power generation performance of a thermoelectric module.

While the present invention has been shown and described with reference to the exemplary embodiments thereof, it will be understood by those skilled in the art that various changes in form and details may be made therein without departing from the spirit and scope of the present invention as defined by the appended claims.

What is claimed is:
1. A thermoelectric module comprising:
a first metal substrate including a first through-hole;
a first insulating layer disposed on the first metal substrate;
a first electrode part disposed on the first insulating layer and including a plurality of first electrodes;
a plurality of thermoelectric legs disposed on the first electrode part;
a second electrode part disposed on the plurality thermoelectric legs and including a plurality of second electrodes;
a second insulating layer disposed on the second electrode part; and
a second metal substrate disposed on the second insulating layer and including a second through-hole,
wherein the first metal substrate includes an effective region in which the first electrode part is disposed and a peripheral region formed outside the effective region,
wherein the second metal substrate includes an effective region in which the second electrode part is disposed and a peripheral region formed outside the effective region,
wherein the first through-hole is disposed in the effective region of the first metal substrate,
wherein the first through-hole and the second through-hole are formed at positions corresponding to each other,
wherein the first metal substrate includes a first hole arrangement region which is a space formed by connecting surfaces of the first electrodes which are closest to the first through-hole and are disposed adjacent to each other,
wherein an area of the first hole arrangement region is four times or more than an area of one of the plurality of first electrodes, and
wherein a withstand voltage is 1 kV or more.

2. The thermoelectric module of claim 1, wherein a diameter of the first through-hole differs from a diameter of the second through-hole to correspond to the first through-hole.

3. The thermoelectric module of claim 2, further comprising an insulating insertion member disposed in a peripheral region of the second through-hole.

4. The thermoelectric module of claim 3, wherein the diameter of the first through hole is smaller than the diameter of the second through hole.

5. The thermoelectric module of claim 4, further comprising a coupling member disposed among the first through-hole, the second through-hole and the insulating insertion member.

6. The thermoelectric module of claim 5, wherein the first insulating layer includes a resin and an inorganic filler.

7. The thermoelectric module of claim 6, wherein the resin includes at least one of an epoxy resin and a silicon resin, and the inorganic filler includes a compound of at least one of aluminum, silicon and boron.

8. The thermoelectric module of claim 7, wherein the first metal substrate further includes another first hole arrangement region.

9. The thermoelectric module of claim 1, wherein the area of the first hole arrangement region is eight times or more the area of one of the plurality of first electrodes, and
wherein the withstand voltage is 2.5 kV or more.

10. The thermoelectric module of claim 5, wherein the diameter of the second through-hole is 1.1 to 2.0 times the diameter of the first through-hole.

11. The thermoelectric module of claim 1, wherein an area of the first metal substrate and an area of the second metal substrate differ from each other.

12. The thermoelectric module of claim 11, further comprising a third through-hole formed in a peripheral region of the first metal substrate.

13. The thermoelectric module of claim 12, wherein the area of the second metal substrate is smaller than the area of the first metal substrate.

14. The thermoelectric module of claim 12, wherein a ratio of the area of the second metal substrate to the area of the first metal substrate ranges from 0.5 to 0.95.

15. The thermoelectric module of claim 13, further comprising another second metal substrate spaced apart from the second metal substrate.

16. The thermoelectric module of claim 8, wherein the second metal substrate includes a second hole arrangement region which is a space formed by connecting surfaces of the second electrodes which are closest to the second through-hole and are disposed adjacent to each other, and
the first hole arrangement region and the second hole arrangement region are formed at positions corresponding to each other.

17. The thermoelectric module of claim 1, further comprising a third insulating layer disposed between the first metal substrate and the first insulating layer and including a resin and an inorganic filler.

18. The thermoelectric module of claim 17, wherein the first insulating layer and the third insulating layer include same materials.

19. The thermoelectric module of claim 1, wherein the withstand voltage is a characteristic that is maintained without insulation breakdown for 10 seconds under an alternating current (AC) voltage of 2.5 kV and a current of 1 mA.

20. A power generation apparatus comprising:
a thermoelectric module according claim 1; and
a cooling unit connected to the first metal substrate of the thermoelectric module and including a through hole,
wherein the through hole of the cooling unit is formed at a position corresponding to the first through-hole, and
a coupling member is disposed on the through hole of the cooling unit.

* * * * *